United States Patent [19]

Peek et al.

[11] Patent Number: 5,449,931
[45] Date of Patent: Sep. 12, 1995

[54] CHARGE COUPLED IMAGING DEVICE HAVING MULTILAYER GATE ELECTRODE WIRING

[75] Inventors: Hermanus L. Peek, Eindhoven, Netherlands; Eleonore J. M. Daemen, Lumbin, France; Jan T. J. Bosters, Eindhoven, Netherlands

[73] Assignee: U.S. Philips Corporation, New York, N.Y.

[21] Appl. No.: 246,535

[22] Filed: May 20, 1994

[30] Foreign Application Priority Data

May 21, 1993 [EP] European Pat. Off. ........... 93201463

[51] Int. Cl.⁶ .................... H01L 29/78; H01L 27/14; H01L 31/00
[52] U.S. Cl. .................... 257/231; 257/220; 257/221; 257/241; 257/246; 257/247; 257/250
[58] Field of Search .............. 257/231, 241, 246, 249, 257/250, 220, 221

[56] References Cited

U.S. PATENT DOCUMENTS

| | | | |
|---|---|---|---|
| 3,890,633 | 6/1975 | Kosonocky | 357/24 |
| 4,012,459 | 3/1977 | Takeya et al. | 260/873 |
| 5,365,092 | 11/1994 | Janesick | 257/236 |

FOREIGN PATENT DOCUMENTS 0496443  7/1992  European Pat. Off. .

*Primary Examiner*—Ngân V. Ngô
*Attorney, Agent, or Firm*—Steven R. Biren

[57] ABSTRACT

In charge coupled imaging devices, a major portion of the photosensitive surface area is covered by electrodes with which the charge storage and the charge transport in the semiconductor body are controlled. These electrodes are preferably made of polycrystalline silicon. This material, however, like other conductive materials known per se, has a comparatively high absorption coefficient, in particular in the short-wave portion of the visible spectrum (blue), which adversely affects the sensitivity. According to the invention, the electrodes are manufactured partly from a very thin poly layer, preferably not thicker than 50 nm, and partly from a less transparent but higher conductivity layer, for example, poly of much greater thickness. The electrodes are so provided that the major portion of the surface area is covered by the thin, transparent layer and only a comparatively small portion by the less transparent, thick poly layer, parts of the latter being in addition used for the electrical connection of the electrodes made from the very thin poly.

15 Claims, 5 Drawing Sheets

CHARGE COUPLED IMAGING DEVICE HAVING MULTILAYER GATE ELECTRODE WIRING

BACKGROUND OF THE INVENTION

The invention relates to a charge coupled imaging device with a semiconductor body in which a charge transport channel is defined at or adjacent a surface for the storage and transport of electric charge, which surface is provided with a series of gate electrodes in the form of conductive layers which are electrically insulated from the surface by an interposed gate dielectric, the device being designed for receiving electromagnetic radiation which is captured at least partly in or adjacent the charge transport channel through the gate electrodes and through the surface and is converted into electric charge through absorption.

The device may be a one-dimensional sensor or a line sensor. In the most widely used embodiment, the device forms a two-dimensional imaging device. A known type of two-dimensional imaging device which is used both in professional cameras and in consumer cameras is the frame transfer sensor, often called FT sensor for short, in which an image captured in the imaging section during a certain integration time is quickly transported into a memory section after the integration time in order to be read out there line by line. In the present document, the invention will be described in particular with reference to an FT sensor. It should be borne in mind, however, that the invention is not limited to imaging devices of the FT type, but may also be advantageously applied to other types of sensors such as line sensors or two-dimensional sensors in which the imaging section at the same time performs the function of a memory section, i.e. which do not comprise a separate memory section. In general, the invention is applicable to all types of CCD imaging devices in which the conversion of radiation into electric charge takes place in or at least in the immediate vicinity of the charge transport channel.

Since the charge transport layer in this type of imaging device at the same time forms the photosensitive elements in which the conversion from electromagnetic radiation to electric charge takes place, the radiation must penetrate the subjacent semiconductor body through the gate electrodes, at least in the usual case of illumination through the upper side. This always leads to a loss in sensitivity owing to absorption. The absorption is not the same for all wavelengths in the visible range of the spectrum, but comparatively great for blue and comparatively small for red when the gate electrodes, as is usual, are made of silicon, often in polycrystalline form, which is usually referred to as poly. Various measures have been proposed to prevent this loss of sensitivity. Thus it was proposed, for example, to illuminate the device from behind, where it is free from electrodes. This method, however, has the drawback that additional, complicated process steps are necessary, such as rendering the semiconductor body thin by etching or polishing. It was also suggested to use a different, more transparent material instead of poly such as, for example, doped tin oxide for the gate electrodes. Such materials, however, are usually less easy to handle and therefore less attractive in integrated circuits than is poly. It is further known to provide gate electrodes, whether or not made of poly, which have windows within which the surface of the semiconductor body is free from electrode material. This method does provide a considerable improvement and requires no process changes, but it has the drawback that the windows can only be comparatively small because a substantial portion of the channel must remain covered by gate electrodes.

It was suggested in the published European Patent Application EP-A 496,443 to use very thin poly for the gate electrodes instead of poly of the usual thickness (400–500 nm), for example, with a thickness of approximately 50 nm in order to limit the absorption in the poly as much as possible. Owing to the high sheet resistivity, i.e. the resistivity divided by the thickness, and the accompanying high resistance values in the poly tracks, it is not possible in this case to provide electrical connections at the edge of the matrix only, but the poly tracks are connected at regular intervals by means of low-ohmic tungsten connections which extend over the gate electrodes parallel to the transport direction of the device. The tungsten connections are separated from the poly electrodes by a dielectric layer in which windows are provided at the areas of the contacts. It was found in practice that the provision of these contacts on the thin poly may give rise to problems. It is possible in particular that, owing to an insufficient selectivity during etching of the contact windows, a too large portion of the poly is removed for a satisfactory contact to be formed. Another problem may arise with the use of a mosaic color filter in which sharply defined boundaries between the pixels corresponding to the mosaic pattern of the filter are desirable. When a single thin poly layer is used, the entire surface is in principle photosensitive, so that the boundaries between the pixels are not sharply defined. Furthermore, it is sometimes desirable to provide locally doped zones in the charge transport channel which must be accurately aligned in relation to the gate electrodes. Such zones are provided, for example, for the purpose of 2-phase operation such as described, for example, in U.S. Pat. No. 4,012,459. Another major application of such zones is to increase the charge storage capacity when the surface is brought into the inverted state during integration for reducing the dark current (All Gate Pinning or AGP mode), such as described inter alia in European Patent Application no. 93200598.6 filed Mar. 3 1993 under the title "Charge coupled device". The alignment of these zones relative to the electrodes is difficult in the case of a single poly layer.

SUMMARY OF THE INVENTION

The invention has for its object inter alia to provide a charge coupled imaging device in which the problems described above are avoided entirely or at least partly, while a high sensitivity is retained.

According to the invention, a device of the kind described in the opening paragraph is characterized in that the gate electrodes are provided in a multilayer wiring with a first layer of deposited silicon of such a small thickness that a comparatively high transparency is obtained with a comparatively high sheet resistivity, and with a second layer having a comparatively low sheet resistivity and a comparatively low transparency, while the gate electrodes or portions thereof which are constructed as part of the second layer have a length which is smaller than the length of the gate electrodes or portions thereof which are constructed as part of the first layer.

The use of a second, less transparent layer for the electrodes does lead to some loss in sensitivity. Since the electrodes in the second layer are small compared with the electrodes (or portions thereof) in the first layer, however, this loss can be reduced to acceptable levels. On the other hand, the use of a second layer for the electrodes as described above provides major advantages. The second layer, which is made of a suitable metal or of poly whose resistivity may be much lower than that of the thin first poly layer, may be used in specific embodiments for forming a low-ohmic connection for electrodes or portions of electrodes constructed as part of the first layer. Whether or not in combination herewith, the use of two wiring layers renders it possible to provide zones in the channel which are accurately aligned relative to the electrodes in that first electrodes are defined in the lower wiring layer, then a doping step is performed, and then the other wiring layer is deposited and the other electrodes are defined therein.

In embodiments made for color cameras in which a mosaic color filter is used, the less transparent electrodes or electrode portions may be advantageously used as pixel limiters, the mosaic pattern being so provided that the transitions between the various filter elements coincide with electrodes of the second layer.

A suitable metal, for example tungsten or molybdenum, may be used for the second layer. A version which has major advantages inter alia from a technological point of view, for example because of the fact that a comparatively thick poly layer is necessary anyway, inter alia in the peripheral electronics, so that an additional wiring layer can be avoided, is characterized in that the second layer is formed by a layer of deposited silicon with a thickness greater than that of the first layer.

A first type of charge coupled imaging device in which the electrodes or portions of electrodes manufactured from the thin poly layer are connected to voltage sources through the second layer, is characterized in that each gate electrode is formed by a gate electrode portion provided in the second layer of lowest transparency and by a gate electrode portion connected thereto in conductive manner and provided in the first layer of highest transparency. In this version, accordingly, each electrode is formed by a portion in the first layer and a portion in the second layer. Separate metal contacts to electrodes made of thin poly are not necessary in this version.

A second type of charge coupled imaging device according to the invention is characterized in that the gate electrodes are covered with an electrically insulating layer and the gate electrodes provided in the first layer are connected to a metal track through contact windows in the insulating layer. In this embodiment, in contrast to the preceding embodiment, extra connections are necessary for the electrodes in the thin poly layer. On the other hand, the major advantage is obtained that the number of electrodes in the second, less transparent layer can be smaller per pixel than in the preceding embodiment. In a 4-phase embodiment, for example, four tracks in the second layer are necessary for each pixel in the first embodiment, and only two in the second embodiment, which leads to an improvement in sensitivity. A preferred embodiment of a device according to the invention, in which problems in contacting of the thin poly electrodes are avoided without additional process steps, is characterized in that at the areas of the contact windows a contact surface is provided in a different conductive layer of a greater thickness, preferably in the second layer, which contact surface is conductively connected to the associated gate electrode constructed in the first layer. To counteract losses in sensitivity caused by the said contacts and metal connections as much as possible, the contact windows are preferably provided above a boundary zone which laterally bounds the charge transport channel within the semiconductor body in usual manner.

An important field of application of CCD imaging devices is that of single-chip color cameras in which a color filter is preferably provided on the image sensor itself. An embodiment of such an image sensor according to the invention in which a good separation of the colors is obtained is characterized in that a mosaic color filter is provided above the electrodes, the boundaries between different color filter elements above a common charge transport channel coinciding with gate electrodes or gate electrode portions constructed as part of the second layer of comparatively low transparency.

A good sensitivity may be obtained when the thickness of the thin poly is at most approximately 75 nm. Preferably, this thickness is approximately 50 nm. The thickness of the comparatively thick poly layer preferably is at least approximately 250 nm. A favorable value at which a sufficiently low resistance can be obtained is at least 400 nm.

BRIEF DESCRIPTION OF THE DRAWING

The invention will be explained in more detail with reference to several embodiments and the accompanying drawing, in which.

DESCRIPTION OF THE PREFERRED EMBODIMENTS

It is noted that the Figures are diagrammatic and not drawn to scale.

Figure 1:
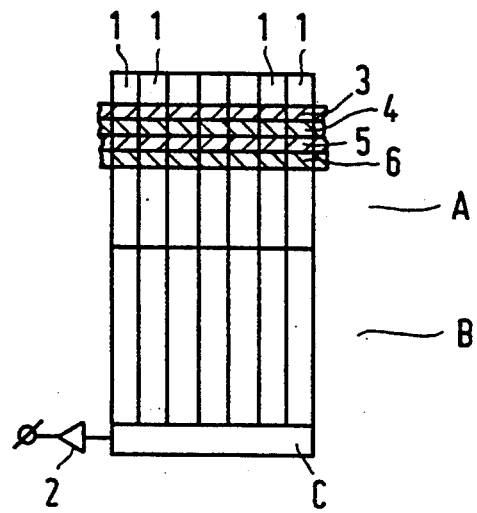
FIG. 1 is a diagram of an FT charge coupled imaging device in which the invention has been realized.

FIG. 1 represents a diagram known per se of a charge coupled imaging device of the so-called Frame Transfer or FT type comprising a system of CCD channels 1 lying next to one another and mutually separated by channel bounding zones which are known per se. The channels 1 run from top to bottom in the drawing; it will be obvious, however, that this is not essential and that the transport direction may alternatively be rotated through an angle of, for example, 90 degrees. The system of channels is subdivided into an imaging section A and a memory section B lying in the extension of and merging into the former. The channels 1 form the parallel inputs of the horizontal read-out register C whose output is connected to an output amplifier 2. A system of clock electrodes is provided over the channels for controlling the charge transport and the charge storage in the channels. Four of these electrodes, i.e. the electrodes 3–6, are shown over a portion of the imaging section in FIG. 1; however, it is obvious to those skilled in the art that such electrodes have been provided over the entire length of the channels 1.

During operation, a radiation image is projected on the surface of the imaging section A during a certain time, the integration period. The charge generated in the semiconductor body during this period is stored under the electrodes in the form of discrete packages and subsequently transported from the imaging section A into the memory section B. Since the radiation must at least partly pass through the electrodes 3–6, it is desirable to use a thin conductive layer for the electrodes in order to minimize losses in sensitivity caused by absorption in the electrodes. On the other hand, it is desirable to choose this thickness to be greater because of the resistance of the electrodes. It is important to drive the electrodes with the highest possible clock frequency for obtaining a fast transport in order to prevent "smear", which is caused by the fact that charge is also integrated also during transport. The maximum frequency is determined to a major degree by the resistance in the electrodes, which means in general that the transport is faster, and accordingly the smear less strong, in proportion as the electrodes are thicker.

Figure 2:
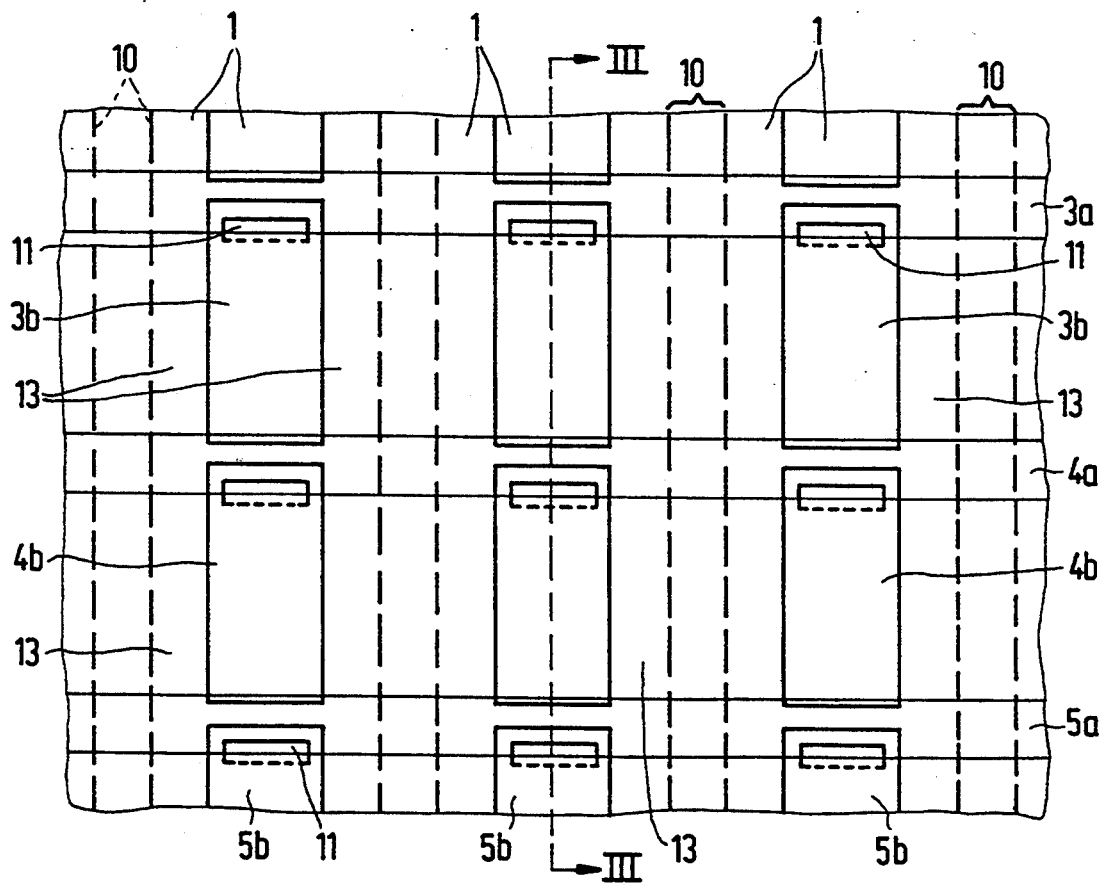
FIG. 2 is a plan view of a portion of the imaging section of the device of FIG. 1.
Figure 3:
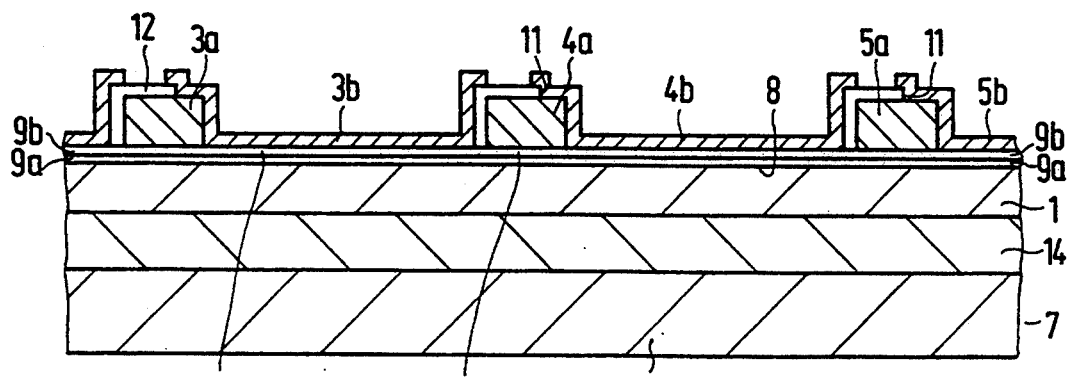
FIG. 3 is a cross-section of this device taken on the line III—III in FIG. 2.

FIG. 2 and FIG. 3 are a plan view and a cross-section, respectively, of a portion of the imaging section provided with an electrode configuration according to the invention. The device comprises a semiconductor body 7 which in this example is made of silicon but which may obviously also be made of an alternative semiconductor material suitable for the purpose for which the device was made. The charge transport channels 1 are situated at or near the surface 8, and are mutually separated by the channel bounding zones 10, indicated in FIG. 2 with broken lines. The surface 8 which lies at the side where the electromagnetic radiation is captured and is converted into electric charge through absorption in the semiconductor body, is covered by a thin electrically insulating layer 9 which forms a gate dielectric between the electrodes and the surface 8. The gate dielectric 9 may comprise a single layer of oxide or some other electrically insulating material. In the present example, the gate dielectric comprises a layer $9b$ of silicon nitride on a layer $9a$ of silicon oxide.

According to the invention, the gate electrodes of which FIGS. 2 and 3 only show the electrodes 3, 4 and 5 are provided in a two-layer wiring. The electrode portions whose reference numerals have the suffix "b" are formed in a first layer provided in the form of deposited silicon, usually but not necessarily in polycrystalline form (poly). Poly is a widely used material for the wiring in the manufacture of integrated circuits. In contrast to poly of usual thickness, for example approximately 400 nm, however, the thickness of the poly of the electrodes $4b$, $5b$, $6b$, etc. is no more than approximately 50 nm. This thickness is so small that practically all light is transmitted, also blue light for which the absorption coefficient of poly is greatest in the visible range of the spectrum. The small thickness of the poly layer also means that the sheet resistivity, defined as the resistivity divided by the thickness, is high. The electrodes or portions of electrodes whose reference numerals have the suffix "a" are formed in a second wiring layer with a comparatively low sheet resistivity and a comparatively low transparency. A suitable metal may in principle be chosen for this layer, such as W or Mo or an alloy of silicon with a metal (silicide). In the present example, the electrodes $4a$, $5a$, $6a$, etc. are also made of poly, but with a thickness of approximately 400 nm, i.e. a usual thickness for the wiring in integrated circuits, so a much greater thickness than the poly of the electrodes b.

It is noted for greater clarity that the designations "first and second wiring layer" are merely used to distinguish these layers from one another and should not be interpreted as an indication of the sequence in which the layers are provided during manufacture.

The poly layers are locally, where they overlap, separated from one another by an interpoly dielectric 12 of, for example, an oxide or some other suitable dielectric material. The very thin poly electrodes $3b$, $4b$, etc. are each connected to a corresponding electrode $3a$, $4a$ etc. formed in the thick, but less transparent poly through windows 11 in the oxide layer 12. The electrodes $3b$, $4b$, $5b$, etc. formed in the transparent, thin poly layer can thus be electrically connected to the usual clock voltage sources through the electrodes $3a$, $4a$, etc. Since the contacts between the two poly layers can be provided at regular distances, in the present embodiment a contact for each phase above each charge transport channel, adverse effects of the comparatively high resistance in the thin poly are avoided.

The electrodes $3b$, $4b$, $5b$, etc. formed in the thin poly, may be each provided as a single, coherent conductor strip which extends transversely over the system of charge transport channels 1 in a manner analogous to that of the electrodes $3a$, $4a$, $5a$. In the present embodiment, however, the electrodes $3b$, $4b$, $5b$ are formed by mutually separated spots which leave openings (windows) 13 exposed within which the surface of the imaging sensor is free from poly, whereby the sensitivity is further improved, in particular the blue sensitivity.

The device as shown in FIG. 3 is of the buried channel type, although the invention may also be advantageously applied to imaging devices with surface channels. The charge transport channel 1 is formed by a thin n-type surface layer in the present case of an n-channel device (in the case of a p-channel device, a p-type surface layer). The layer 1 is bounded at the lower side by a p-type layer 14 which separates the layer 1 from the n-type substrate 15. The npn configuration described here is known per se and has the advantage inter alia that excess charge can be drained off through the substrate in the case of overexposure, whereby blooming is prevented.

The device may be manufactured by techniques known per se. After the formation of the channels 1, and of the channel bounding zones 10 which are p-type surface zones, the gate dielectric 9 is provided with a lower layer $9a$ of oxide and a layer $9b$ of silicon nitride deposited thereon. Then a lower poly layer is provided, doped with, for example, phosphorus in a high concentration for obtaining the lowest possible resistance. The thickness of this poly layer is approximately 400 nm and is such that this poly layer is suitable not only for the electrodes 3a, 4a, 5a, but also for forming, for example, gate electrodes of MOS transistors in the peripheral electronics and/or connections between various circuit elements. The electrodes 3a, 4a, 5a are formed from this poly layer by known masking and etching techniques, if so desired simultaneously with other elements such as gates of transistors. The length of the electrodes 3a, 4a, 5a is approximately 1.4 μm. After the masking layer used for this has been removed, the interpoly dielectric 12 is provided, for example, through oxidation of the poly electrodes previously formed. Openings 11 are formed in the oxide layer 12 through masking and etching, so that the edge of each electrode is exposed on the right-hand side while the opposed edge remains covered. This etching treatment may be carried out selectively in relation to the nitride of the layer 9b, so that the gate dielectric 9 is not or substantially not attacked. The provision of the mask used for this etching step, accordingly, is not very critical.

The exposed portions of the nitride layer 9b between the electrodes 3a, 4a, 5a may then be removed, if so desired. If not, it may be advantageous to maintain the nitride between the electrodes 3a, 4a, 5a, as shown in FIG. 3. Then the thin poly layer, with a thickness of 50 nm, is provided and also doped with phosphorus to reduce the resistance. It is noted that the sheet resistivity of the thin poly layer is greater than that of the poly layer mentioned above by approximately one order of magnitude (given an equal doping) owing to the difference in thickness. Since each electrode 3b, 4b, 5b is directly connected to a low-ohmic electrode formed in the thick poly layer, however, the high sheet resistivity of the thin poly layer has no or substantially no adverse effects on the operation of the device, in particular as regards the speed. After the deposition and doping of the thin poly layer, the electrodes 3b, 4b, 5b are defined by means of masking and etching techniques known per se. The length of the electrodes 3b, 4b, 5b, i.e. the length of the portions of these electrodes which are directly provided on the dielectric layer 9, is approximately 4 μm. If the etching treatment of the exposed nitride mentioned above has not taken place, the nitride portions of the layer 9b lying in the windows 13 may as yet be removed through etching in this stage of the process. The system of electrodes of the charge coupled device is then ready in principle. The device may subsequently be subjected to further usual process steps such as the application of a passivating layer, metallization, and the accommodation of the device in a usual envelope.

Figure 4:
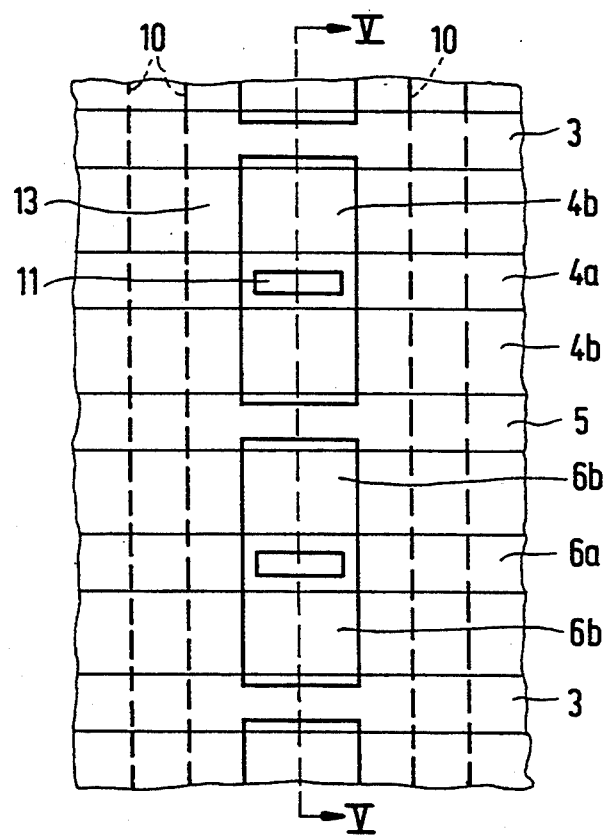
FIG. 4 is a plan view of a modification of the preceding embodiment.
Figure 5:
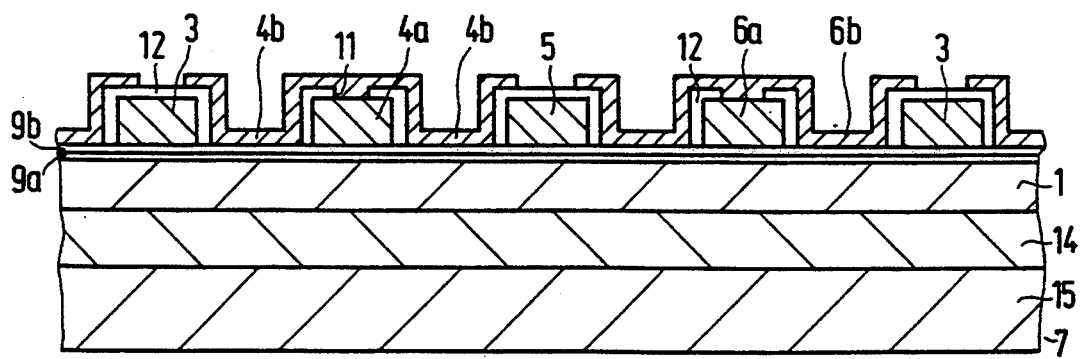
FIG. 5 is a cross-section of this device taken on the line V—V.

FIG. 4 and FIG. 5 show in plan view and in cross-section taken on the line V—V, respectively, a modification of the device described above. For easy reference, corresponding components in this embodiment have the same reference numerals as in the preceding embodiment. The electrodes formed in the thick poly layer are not all connected to an electrode formed in the thin poly layer, but only every second electrode is thus connected. In the embodiment shown in the drawing, the electrode 3 is formed only by a narrow strip of thick poly which, in the case of a 4-phase CCD, is connected to phase 1. The next phase, i.e. phase 2, comprises the electrode 4a of thick poly and the electrode 4b of thin poly connected to the former. Electrode 4b is connected to electrode 4a through the contact window 11 in the oxide layer 12 and extends in the longitudinal direction of the CCD channel on either side of the electrode 4a. The next electrode, connected to phase 3, is formed again by a single strip 5 of thick poly. Phase 4 is again applied to an electrode 6 which is composed in the same manner as the electrode 4, i.e. from the electrode 6a of thick poly and the electrode 6b of thin poly. This pattern is repeated until a channel of the desired length has been obtained. Compared with the preceding embodiment, this embodiment has among its advantages a better resolution, because adjoining pixels can be mutually separated during recording by (one of) the narrow electrodes 3 and 5 which are not provided with an extension in the thin poly. The electrodes may further be connected to clock lines (not shown) at the side of the matrix in a usual manner, which lines are connected to the electrodes 3, 4a, 5 and 6a in the thick poly.

Figure 6:
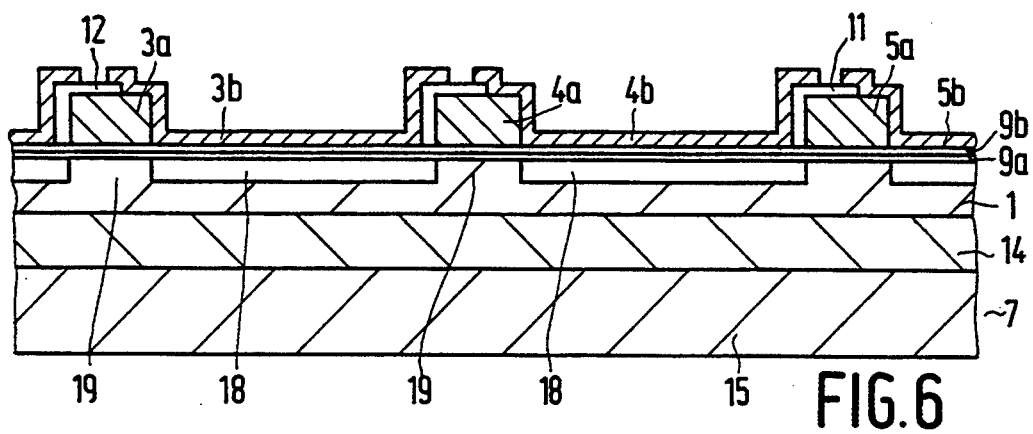
FIG. 6 is a cross-section of a further modification of the device according to FIG. 3.

FIG. 6 is a cross-section of a device which is practically identical to the device of FIG. 3 as regards the electrode configuration. The main difference with the device of FIG. 3 consists in that doped n-type zones 18 of the same conductivity type as and with a higher doping level than the layer 1 are present in the charge transport channel 1 below the electrodes 3b, 4b, 5b formed in the thin poly. The higher doping concentration of the zones 18 causes a profiled potential distribution in the channel 1, as is well known, with potential wells (for electrons) in or below the zones 18 and potential barriers in the more weakly doped regions 19 between the zones 18. This may be utilized for operating the device as a 2-phase CCD, in which the electrodes 3b, 4b, 5b form the charge storage electrodes and the electrodes 3a, 4a, 5a the transfer electrodes. In an alternative embodiment as described inter alia in the cited European Patent Application, in which a CCD imaging device is described with inversion below all electrodes during integration while the desired potential profile is obtained by means of a doping profile in the channel, the doping profile may be obtained by means of the zones 18. The device can be operated as a usual 2-phase CCD during read-out. The device may, however, be alternatively be operated advantageously as a 4-phase CCD as described in the cited prior application.

Figure 7:
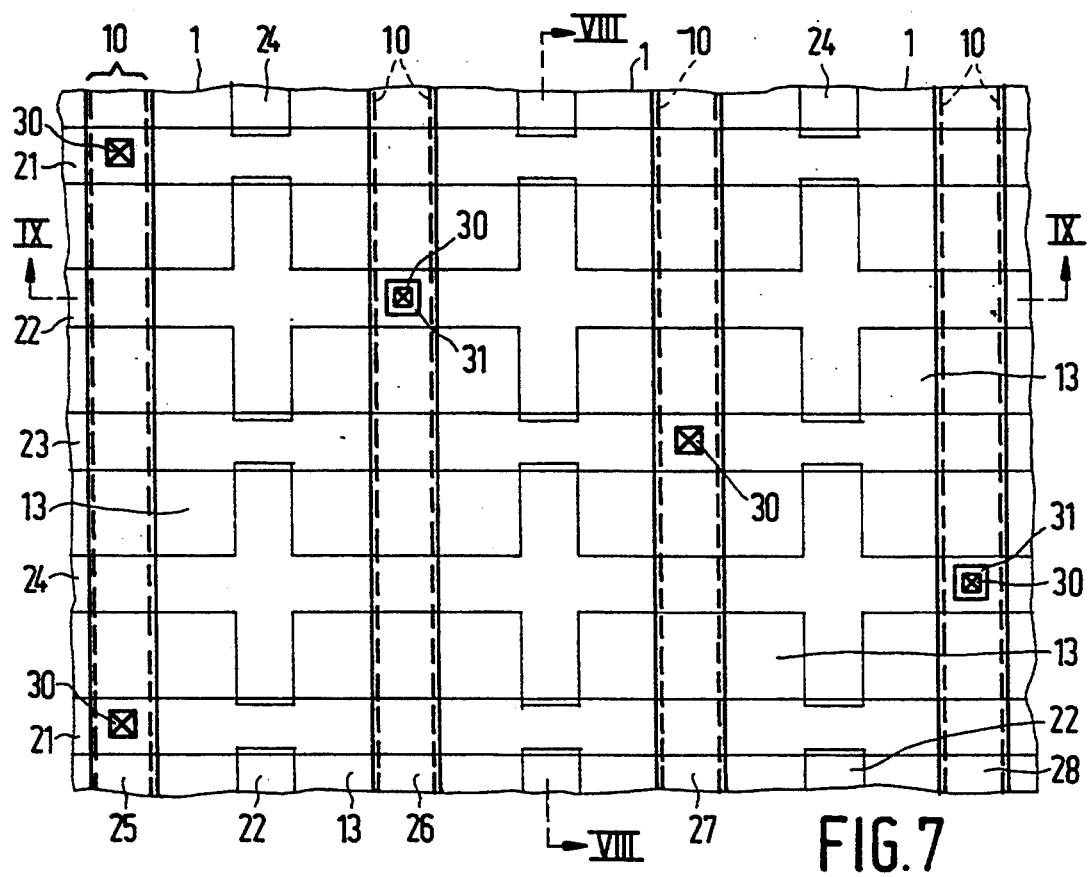
FIG. 7 is a plan view of a further embodiment of an imaging device according to the invention.
Figure 8:
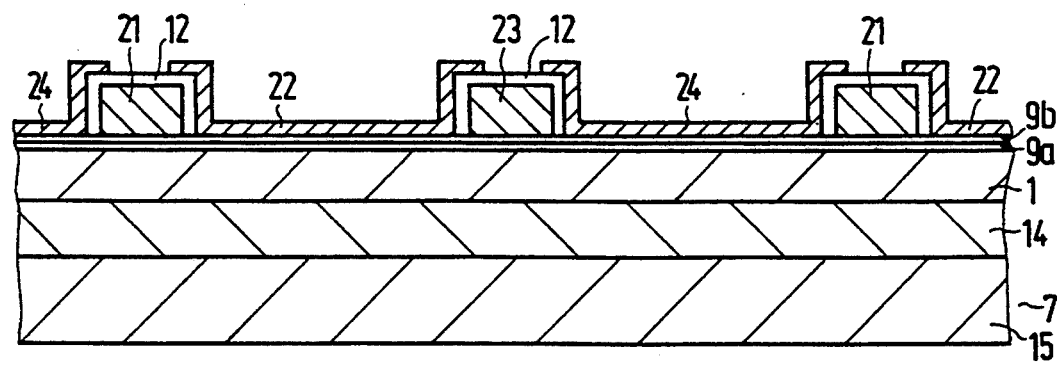
FIG. 8 is a cross-section of this device taken on the line VIII—VIII.
Figure 9:
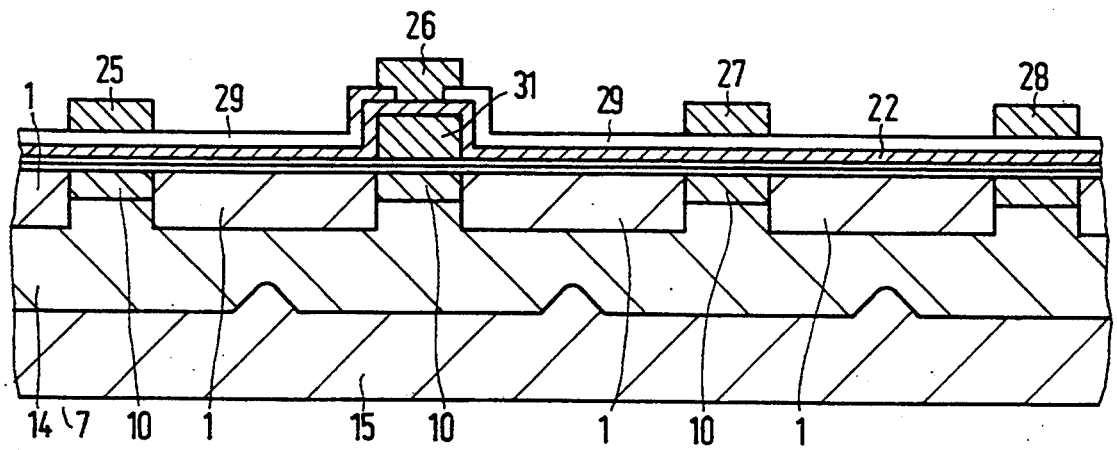
FIG. 9 is a cross-section of this device taken on the line IX—IX in FIG. 7.

In the embodiments described thus far, the electrodes made from the thin poly layer had a conductive connection to the electrodes made from the thick poly layer, so that problems in the interconnection between the metal track and the thin poly are fully avoided. FIGS. 7–9 show an example of an embodiment in which also the thin poly electrodes are provided with a metal connection. Corresponding components in the drawing are given the same reference numerals as in the preceding embodiments as much as possible. The device again comprises a number of CCD channels 1 of the buried n-channel type situated next to one another and mutually separated by p-type boundary zones, indicated in FIG. 7 with broken lines. The channels 1 are formed by n-type surface regions which are separated from the n-type substrate 15 by the p-type region 14. The surface of the semiconductor body is covered with a gate dielectric again comprising an oxide/nitride double layer 9a, 9b. Clock electrodes are provided on this gate dielectric in two poly layers, the electrodes 21 and 23 formed in a weakly transparent and thick poly layer, and the electrodes 22 and 24 formed in a highly transparent but high-ohmic thin poly layer. The length of the electrodes 21, 23 of thick poly is approximately 1.4 μm again; the length of the electrodes 22, 24 of very thin poly is approximately 4 μm, and was chosen to be much greater than the length of the electrodes of thick poly in view of the photosensitivity of the device. To increase the sensitivity further, the electrodes are so constructed that windows 13 are present between the electrodes where no poly is present.

The electrodes 21, 22, 23, 24 are connected to metal tracks 25, 26, 27, 28, respectively, see also FIG. 9, which tracks extend in the longitudinal direction of the channels 1 over the surface of the device. In the present embodiment, the metal tracks are made of Al, but they may obviously also be made of some alternative suitable electrically conducting material. The metal tracks 25–28 cross the poly electrodes 21–24 and are electrically insulated therefrom by an interposed electrically insulating layer 29 of, for example, silicon oxide. The metal tracks 25–28 are connected to the associated poly electrodes through windows 30 in this oxide layer. The metal tracks 25–28 each correspond to one phase of the charge coupled device, which means in the case of a 4-phase CCD that the tracks 25–28 are or can be connected to one out of every four poly electrodes, as is shown for the metal track 25 in FIG. 7. The metal tracks 25 and 27 may be contacted directly to the 400 nm thick poly electrodes 21 and 23, respectively, without any problem. The electrodes 22 and 24 are so thin, for example 50 nm, that these electrodes may be removed over a too great portion of their thickness in the windows 30 during the etching treatment in which the contact windows 30 were formed in the oxide layer 29, owing to a too low etching selectivity, which renders it difficult to obtain a low-ohmic connection between the metal tracks and these electrodes. To avoid such problems, a contact surface 31 manufactured from a thicker poly layer is provided at each contact window 30, in the present example manufactured together with the electrodes 21, 23 in the thick poly layer, and conductively connected to the associated thin poly electrode 22, 24.

It is noted that the contact surfaces may alternatively be manufactured in a poly layer other than that of the electrodes 21, 23 if two or more poly layers of comparatively great thickness are present in the process. To reduce sensitivity losses caused by the metal tracks 25–28 as much as possible, the metal tracks with the associated contact surfaces 31 are provided above the channel bounding zones 10.

During manufacture, the contact surfaces 31 are formed simultaneously with the electrodes 21, 23, 25 from a common poly layer. Simultaneously with the interpoly oxide layer 12 formed on the electrodes 21, 23, 25, an oxide layer is also formed on the contact surfaces 31. This layer may be removed by etching, during which the oxide on the electrodes is masked against etching. Then the thin poly layer can be deposited which together with the contact surface 31 forms a coherent poly layer of approximately 400 nm thickness at the areas of the contacts to be formed with the metal tracks. This thickness is sufficient for preventing the problems described above and caused by the removal of poly material during the provision of the windows 30 in the oxide layer 29.

It is noted that the electrodes 21, 23, 25 made from a comparatively thick poly layer are connected to metal tracks 25, 27 in this example. It is obviously alternatively possible, in cases in which the resistance values in these electrodes do not become too high, to connect the electrodes 21, 23 to clock lines provided adjacent the matrix in a usual manner and to connect the electrodes 22, 24 only to metal tracks 26, 28 provided over the matrix.

Figure 10:
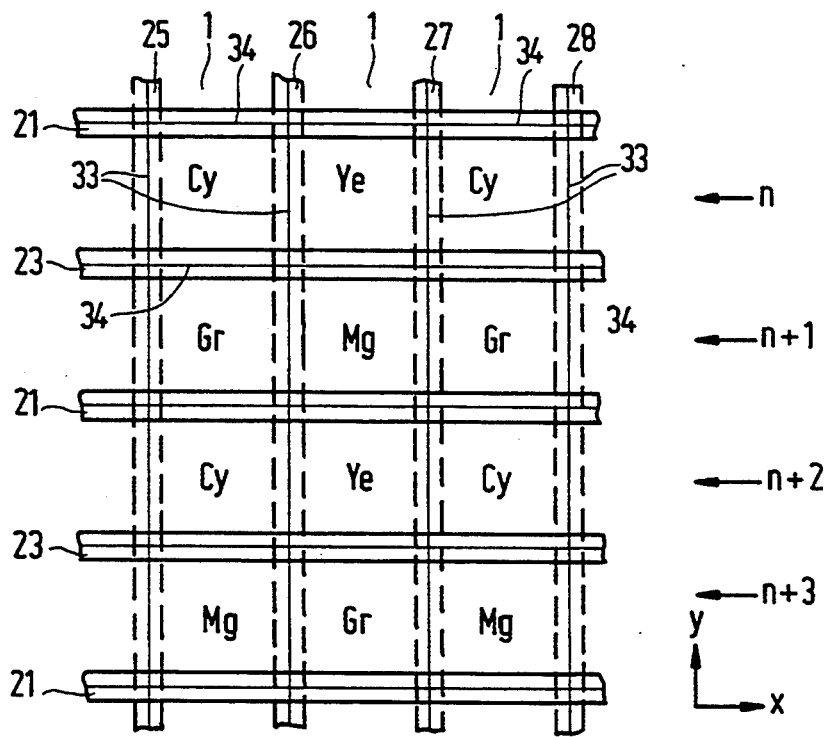
FIG. 10 is a plan view of a further embodiment of an imaging device according to the invention.

FIG. 10 is a diagrammatic plan view of an embodiment of a charge coupled imaging device according to the invention which is provided with a color filter. The description is based on an imaging device as described in the preceding embodiment for the sake of convenience, while of the system of clock electrodes only the electrodes 21 and 23 made from the thick poly layer are diagrammatically shown, as are the metal connections 25–28. The contacts between the poly tracks 21, 23 and the metal tracks 25, 27 are not indicated. Neither are the electrodes 22 and 24 made from the thin poly layer indicated, so as not to render the drawing unnecessarily complicated. These electrodes, however, should be presumed present between the electrodes 21 and 23, as is shown in FIG. 7.

After the electrode system and any further wiring have been completed, the entire assembly is covered in a usual manner with a passivating glass layer, which is also not shown in the drawing. The color filter is provided on this glass layer and formed in the present example by a mosaic filter which is known per se with the elements Cyan (Cy), Green (Gr), Yellow (Ye), and Magenta (Mg). The mosaic is so provided that the edges 33 limiting each color filter element in the x-direction (transverse to the transport direction in the channels 1) coincide with the metal tracks 25–28, and that the edges 34 limiting the elements in the y-direction coincide with the electrodes 21 and 23. Since the region below the metal tracks 25–28 is practically insensitive to radiation and the region of the electrodes 21 and 23 is only weakly sensitive to radiation, an optimum color separation can be obtained, the filter elements being accurately positioned in relation to the image sensing elements.

In the embodiment described here with a 4-phase CCD in which a charge package corresponds to four electrodes 21–24 during transport, two color filter elements are present for every four electrodes. During operation, such voltages are applied to the electrodes that in a first frame the line n is combined with the line n+1, the line n+2 with the line n+3, etc., and that in a next frame the line n is combined with the line n−1, the line n+1 with the line n+2, etc. Part of the signal processing takes place already during the integration in this manner. In an alternative embodiment, it is also possible to provide a single color filter element for every four electrodes, in which case the summation of various color components can take place outside the charge coupled device.

Figure 11:
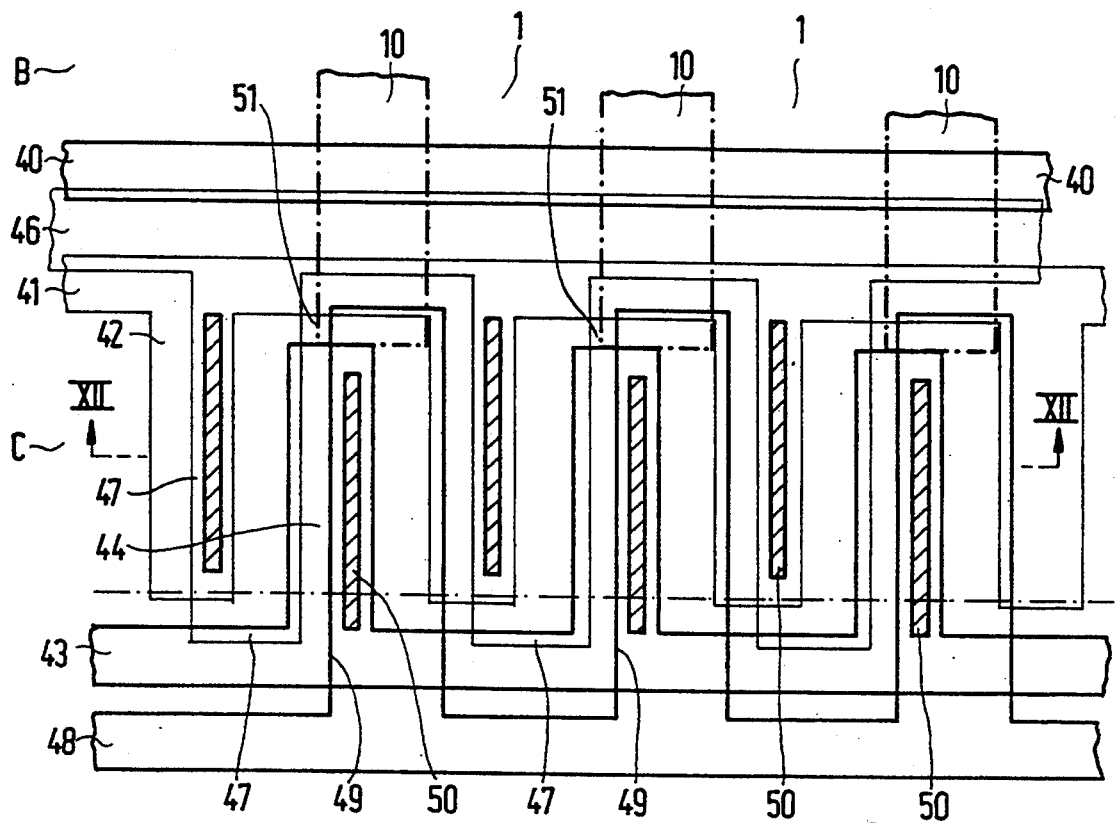
FIG. 11 is a plan view of a possible embodiment of the horizontal output register in a device according to the invention.
Figure 12:
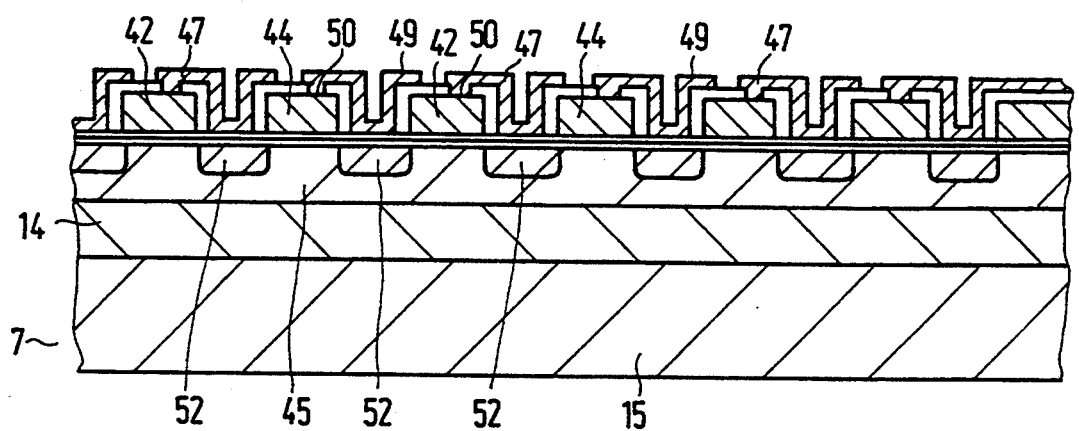
FIG. 12 is a cross-section of this output register taken on the line XII—XII.

In the embodiments described thus far, the construction was given each time of the imaging section of a charge coupled imaging device. In the case of a frame transfer device of which the diagram is shown in FIG. 1, the memory section B may in principle be constructed in the same way as the imaging section, with the proviso that it is not necessary in the memory section to provide windows 13 which are free from poly material. Important technological advantages can be obtained when the horizontal output register C can also be manufactured with the same poly layers. A possible embodiment of such an output register is shown in FIGS. 11 and 12. FIG. 11 shows besides the output register C also the transition between the memory section B comprising channels 1 and the output register. The CCD channels 1 are mutually separated by the channel boundaries 10 which are indicated with dash-dot lines. The transfer of the charge packages from the memory section to the C-register is controlled by means of the transfer gate 40 which may be formed by the last clock electrode of the memory section B. The electrode 40 in this example was manufactured from the thick poly layer which is also used for the electrodes in the imaging section. The output register C comprises two interdigitated, comb-shaped electrode structures 41, 42 and 43, 44 with strip-shaped base portions 41 and 43 from which the fingers 42 and 44, which form the electrodes, extend transversely over the CCD channel 45. The electrode structures 41, 42 and 43, 44 are both manufactured from the same poly layer as the electrode 40. Two further electrode structures are manufactured from the thin poly layer, i.e. the electrode structure 46, 47 with an elongate, strip-shaped base portion 46 and fingers 47 which extend from the base portion 46 transversely over the channel 45, and the electrode structure 48, 49 with an elongate base portion 48 and fingers 49 which again extend from the base portion 48 transversely over the channel 45. The fingers 47 are conductively connected to the fingers 42, while the fingers 49 are conductively connected to the fingers 44. The contacts 50 between the fingers are shown hatched in FIG. 11. To keep the drawing clear, the contacts 50 are limited to windows at the upper side of the electrodes 42, 44; however, it will be obvious that these contacts may extend over the right-hand flanks of the electrodes 42, 44, in a manner analogous to the connection between the electrodes 3a, 3b and between the electrodes 4a, 5b in FIG. 3. The combinations 42, 47 and 44, 49 each form a combined electrode of a 2-phase CCD in which the fingers 42 and 44 form the charge storage electrodes and the fingers 47 and 49 the charge transfer electrodes. To achieve this, a p-type implantation was carried out to reduce the net n-doping below the electrodes 47 and 49 (zones 52), so that the doping level in the zones 52 is lower than it is below the electrodes 42 and 44. Obviously, an implantation which increases the net n-type doping might equally well have been carried out in the zones 52, whereby the electrodes 47 and 49 would form the charge storage electrodes and the electrodes 42 and 46 the charge transfer electrodes. To ensure that the charge transport takes place from fight to left, as in the embodiment drawn, it is indeed necessary here to connect the fingers 47 to the fingers 44 and the fingers 49 to the fingers 44.

The space between the transfer gate 40 and the base portion 41 of the comb-shaped electrode structure 41, 42, which were manufactured from a common poly layer, is filled up by the base portion 46 of the comb-shaped electrode structure 46, 47 made from the other, thin poly layer. As is visible in FIG. 11, small spaces 51 remain which cannot be covered by any of the two poly layers because this would cause short-circuits. It is possible to avoid adverse effects of the uncovered regions 51 on the charge transport in that these regions are located above the channel bounding regions 10 and/or in that an extra p-type implantation is carried out in these regions.

It will be apparent that the invention is not limited to the embodiments given here, but that many more variations are possible to those skilled in the art within the scope of the invention. When two or more poly layers of comparatively great thickness are present in the process, the thick poly electrodes may be manufactured from different layers. It is also possible to use a highly conductive metal layer or a silicide layer instead of the comparatively thick poly layer. The order in which the two poly layers are provided in the embodiments described may be reversed. In the embodiments according to FIGS. 2 and 4, furthermore, the electrodes made from the thick poly layer may alternatively be connected to metal tracks such as the metal tracks 25-28 in the example according to FIG. 7. The invention may be advantageously applied not only to buried channel charge coupled devices, but also to surface channel devices.

We claim:

1. A charge coupled imaging device with a semiconductor body in which a charge transport channel is defined at or adjacent a surface for the storage and transport of electric charge, said surface being provided with a series of gate electrodes in the form of conductive layers which are electrically insulated from the surface by an interposed gate dielectric, the device being designed for receiving electromagnetic radiation which is captured at least partly in or adjacent the charge transport channel through the gate electrodes and through the surface, said radiation being converted into electric charge through absorption, characterized in that the gate electrodes are provided in a multilayer wiring with a first layer divided into a plurality of separate layer portions of deposited silicon of such a small thickness that a comparatively high transparency is obtained with a comparatively high sheet resistivity, and with a second layer having a comparatively low sheet resistivity and a comparatively low transparency, the gate electrodes or portions thereof which are constructed as part of the second layer having a length which is smaller than the length of the gate electrodes or portions thereof which are constructed as part of the first layer.

2. A charge coupled imaging device as claimed in claim 1, characterized in that the second layer is formed by a layer of deposited silicon with a thickness greater than that of the first layer.

3. A charge coupled imaging device as claimed in claim 1, characterized in that each gate electrode is formed by a gate electrode portion provided in the second layer of lowest transparency and by a gate electrode portion conductively connected thereto and provided in the first layer of highest transparency.

4. A charge coupled imaging device as claimed in claim 1, characterized in that the gate electrodes are covered with an electrically insulating layer and the gate electrodes provided in the first layer are connected to a metal track through contact windows in the insulating layer.

5. A charge coupled imaging device as claimed in claim 4, characterized in that at the areas of the contact windows a contact surface is provided in a different conductive layer of a greater thickness, preferably in the second layer, which contact surface is conductively connected to the associated gate electrode constructed in the first layer.

6. A charge coupled imaging device as claimed in claim 4, characterized in that the contact windows are situated above a boundary zone which laterally bounds the charge transport channel within the semiconductor body.

7. A charge coupled imaging device as claimed in claim 4, characterized in that the device forms an M-phase device with M clock voltages which are applied to a group of M consecutive electrodes, which group comprises M/2 electrodes in the first layer and M/2 electrodes in the second layer, where M is an even natural number greater than 1.

8. A charge coupled device as claimed in claim 4, characterized in that the metal track extends over the surface in a direction parallel to the longitudinal direction of the charge transport channel.

9. A charge coupled device as claimed in claim 1, characterized in that a mosaic color filter is provided above the electrodes, the boundaries between different color filter elements above a common charge transport channel coinciding with gate electrodes or gate electrode portions constructed as part of the second layer of comparatively low transparency.

10. A charge coupled imaging device as claimed in claim 2, characterized in that the thickness of the silicon layer of smallest thickness is at most approximately 75 nm.

11. A charge coupled device as claimed in claim 10, characterized in that the thickness of the silicon layer of greatest thickness is at least approximately 250 nm.

12. A charge coupled imaging device as claimed in claim 1, characterized in that the device forms a two-dimensional imaging device of a frame transfer type.

13. A charge coupled imaging device as claimed in claim 2, characterized in that each gate electrode is formed by a gate electrode portion provided in the second layer of lowest transparency and by a gate electrode portion conductively connected thereto and provided in the first layer of highest transparency.

14. A charge coupled imaging device as claimed in claim 2, characterized in that the gate electrodes are covered with an electrically insulating layer and the gate electrodes provided in the first layer are connected to a metal track through contact windows in the insulating layer.

15. A charge coupled device as claimed in claim 2, characterized in that a mosaic color filter is provided above the electrodes, the boundaries between different color filter elements above a common charge transport channel coinciding with gate electrodes or gate electrode portions constructed as part of the second layer of comparatively low transparency.

* * * * *